United States Patent
Hsu et al.

(10) Patent No.: US 7,883,946 B1
(45) Date of Patent: Feb. 8, 2011

(54) ANGLED IMPLANTATION FOR DEEP SUBMICRON DEVICE OPTIMIZATION

(75) Inventors: Che Ta Hsu, San Jose, CA (US);
Christopher J. Pass, San Jose, CA (US);
Dale Ibbotson, Pleasanton, CA (US);
Jeffrey T. Watt, Palo Alto, CA (US);
Yanzhong Xu, Santa Clara, CA (US)

(73) Assignee: Altera Corporation, San Jose, CA (US)

( * ) Notice: Subject to any disclaimer, the term of this patent is extended or adjusted under 35 U.S.C. 154(b) by 2 days.

(21) Appl. No.: 12/151,646

(22) Filed: May 8, 2008

(51) Int. Cl.
*H01L 21/84* (2006.01)
*H01L 21/22* (2006.01)
*H01L 21/38* (2006.01)

(52) U.S. Cl. .................. 438/163; 438/302; 438/369; 438/514; 438/525; 438/531; 257/547; 257/E21.618; 257/E21.633

(58) Field of Classification Search .................. 438/949, 438/948, 952, 950, 163, 302, 369, 514, 525; 257/E21.633, E21.618

See application file for complete search history.

(56) References Cited

U.S. PATENT DOCUMENTS

| | | | | |
|---|---|---|---|---|
| 6,489,223 | B1 * | 12/2002 | Hook et al. | 438/524 |
| 6,562,697 | B1 * | 5/2003 | Cho et al. | 438/424 |
| 6,876,017 | B2 * | 4/2005 | Goodner | 257/254 |
| 7,144,782 | B1 * | 12/2006 | Ehrichs | 438/286 |
| 2002/0000664 | A1 * | 1/2002 | Cheng et al. | 257/758 |
| 2002/0074612 | A1 * | 6/2002 | Bulucea et al. | 257/402 |
| 2007/0072351 | A1 * | 3/2007 | Ishibashi | 438/150 |
| 2008/0012052 | A1 * | 1/2008 | Menut et al. | 257/288 |
| 2009/0091037 | A1 * | 4/2009 | Assefa et al. | 257/773 |
| 2009/0140350 | A1 * | 6/2009 | Zhu | 257/397 |

* cited by examiner

*Primary Examiner*—Ha Tran T Nguyen
*Assistant Examiner*—Aaron A Dehne
(74) *Attorney, Agent, or Firm*—L. Cho

(57) ABSTRACT

A method for forming a submicron device includes depositing a hard mask over a first region that includes a polysilicon well of a first dopant type and a gate of a second dopant type and a second region that includes a polysilicon well of a second dopant type and a gate of a first dopant type. The hard mask over the first region is removed. Angled implantation of the first dopant type is performed to form pockets under the gate of the second dopant type.

29 Claims, 13 Drawing Sheets

ANGLED IMPLANTATION FOR DEEP SUBMICRON DEVICE OPTIMIZATION

TECHNICAL FIELD

Embodiments of the present invention relate to submicron devices such as complementary metal oxide semiconductor (CMOS) devices. More specifically, embodiments of the present invention relate to a method and apparatus for improved angled implantation for deep submicron device optimization.

BACKGROUND

Current state of the art technology for CMOS transistors have low resistance and shallow and abrupt source and drain P-N junctions (extensions). These properties allow the transistor to have reduced source drain parasitic resistance and to control short channel effects. These transistors, however, still suffer from high drain leakage current (high off-state leakage). Drain leakage current in CMOS transistors causes static power issues and is undesirable. Drain leakage current (Idoff) is generated from current from the drain to the source (Isoff), current from the drain to the bulk (Iboff), and current from the drain to the gate (Igoff) when the transistor is off.

Processing of deep submicron devices, such as CMOS transistors, commonly involves shallow angle implantation to place dopant atoms under the gate of the transistors. The implantation of dopant atoms under the gate of the transistors forms pockets which allow the transistors to maximize the drive current between the drain and source. The pockets also allow the transistors to reduce drain leakage current. The maximum manufacturable angle for implant is influenced by the height of neighboring structures of the gate, such as photoresist, and the space between the neighboring structures and the gate. Typically, a larger angle of implantation yields a higher concentration of dopants at the surface of the silicon than the concentration of dopants deeper beneath the gate, which is desirable.

SUMMARY

According to an embodiment of the present invention, a hard mask is used to block angle implantation of dopants of a first type from a region doped with dopants of a second type. The hard mask is used to block the angle implantation instead of photoresist. The density of the hard mask is greater than the density of the photoresist. This allows the amount or height of the hard mask to be less than that of the photoresist and a larger angle to be used during angle implantation. Alternatively, the difference in properties between the hard mask and photoresist may also allow for a smaller distance between the blocking material and a desired region to be doped. It should be appreciated that a combination of both may also be used. Furthermore, a chemical-mechanical polishing procedure may be used on the hard mask to provide a uniform height which reduced variability between submicron devices.

BRIEF DESCRIPTION OF THE DRAWINGS

The features and advantages of the present invention are illustrated by way of example and are by no means intended to limit the scope of the present invention to the particular embodiments shown.

DETAILED DESCRIPTION

In the following description, for purposes of explanation, specific nomenclature is set forth to provide a thorough understanding of embodiments of the present invention. It will be apparent to one skilled in the art that specific details in the description may not be required to practice the embodiments of the present invention. In other instances, well-known components, devices, materials and processes are shown in block diagram form to avoid obscuring embodiments of the present invention unnecessarily.

Figure 1:
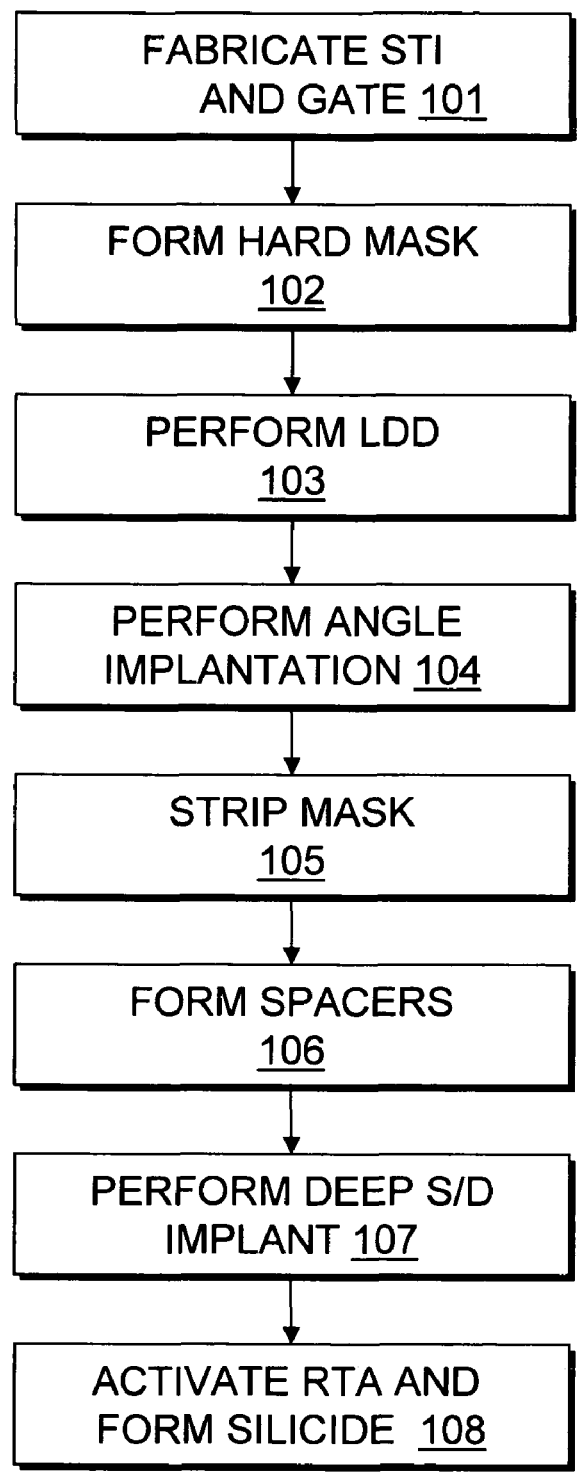
FIG. 1 is a flow chart illustrating a method for fabricating a metal oxide semiconductor transistor according to an embodiment of the present invention.

FIG. 1 is a flow chart illustrating a method for fabricating a metal oxide semiconductor transistor according to a first embodiment of the present invention. At 101, shallow trench isolation and a gate are formed for the transistor. Shallow trench isolation is an integrated circuit feature which prevents electrical current leakage between adjacent semiconductor components.

Figure 2:
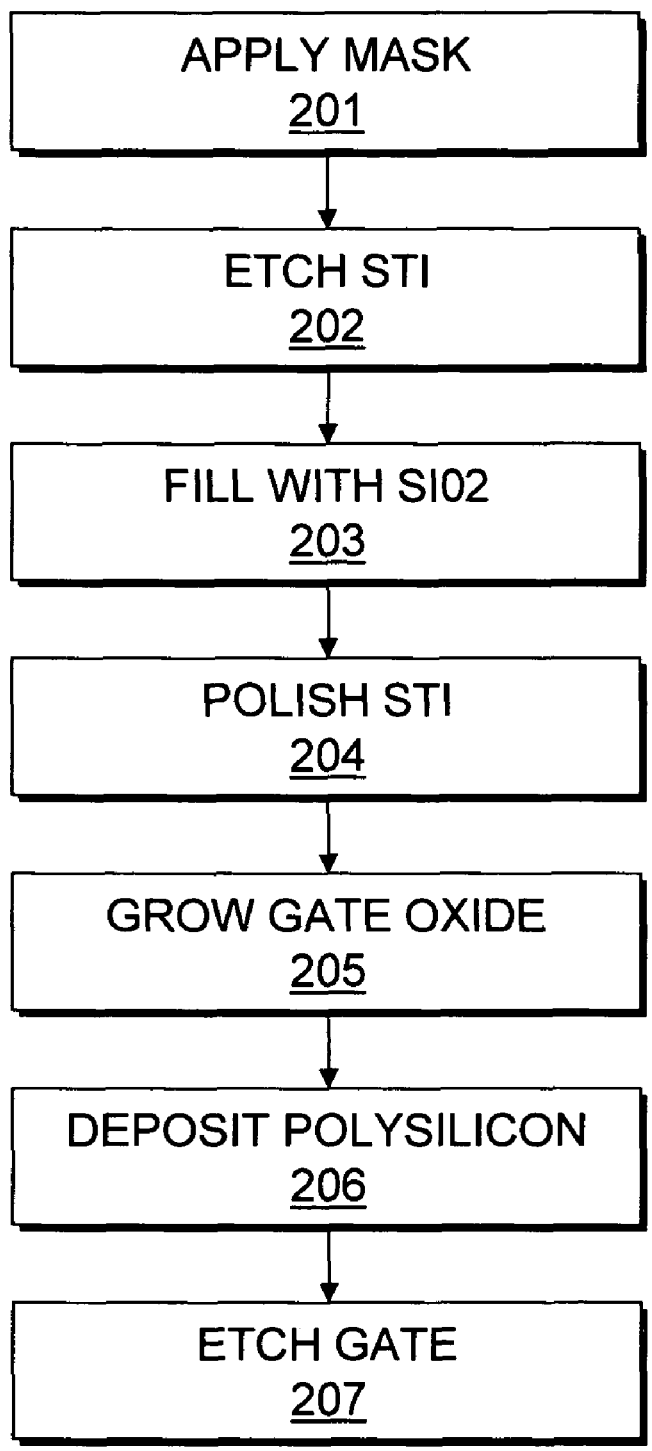
FIG. 2 is a flow chart illustrating a method for fabricating shallow trench isolation and a gate according to an embodiment of the present invention.

FIG. 2 is a flow chart illustrating a method for forming shallow trench isolation and a gate according to an embodiment of the present invention. According to an embodiment of the present invention, the method illustrated in FIG. 2 may be used to implement 101 shown in FIG. 1. At 201, a mask is applied for trench isolation. A photolithography process may be used to cover areas on the silicon that are reserved for trenches with a photoresist material. It should be appreciated that either positive or negative photoresist may be used.

At 202, the exposed areas of the silicon are etched to form trenches.

At 203, the mask is removed and the exposed area is filled with a dielectric. According to an embodiment of the present invention, the exposed area is filled with silicon dioxide.

At 204, excess dielectric is polished off. According to an embodiment of the present invention, chemical-mechanical planarization or other techniques may be used to polish the dielectric.

At 205, an oxide layer is grown. The oxide layer may be used as the gate dielectric for the transistor.

At 206, a layer of polysilicon (polycrystalline silicon) is deposited on top of the oxide. Polysilicon may be used as gate electrode material for the metal oxide semiconductor transistor.

At 207, the polysilicon layer and oxide layer are etched. The polysilicon layer may be patterned and etched to form the interconnects and the metal oxide semiconductor transistor gates. The oxide not covered by polysilicon may also be etched away to expose the bare silicon on which source and drain junctions are to be formed.

Referring back to FIG. 1, at 102 a hard mask is formed on the polysilicon. According to an embodiment of the present invention, the hard mask is formed from a material having a higher density than photoresist. The material is one that may be planarized using a technique such as chemical-mechanical and polish procedure. According to an embodiment of the present invention, forming the hard mask includes depositing the hard mask on the polysilicon, planarizing the hard mask, and patterning the hard mask such that it covers a second region that includes a polysilicon well of the second dopant type while exposing a first region that includes a polysilicon well of the first dopant type.

Figure 3:
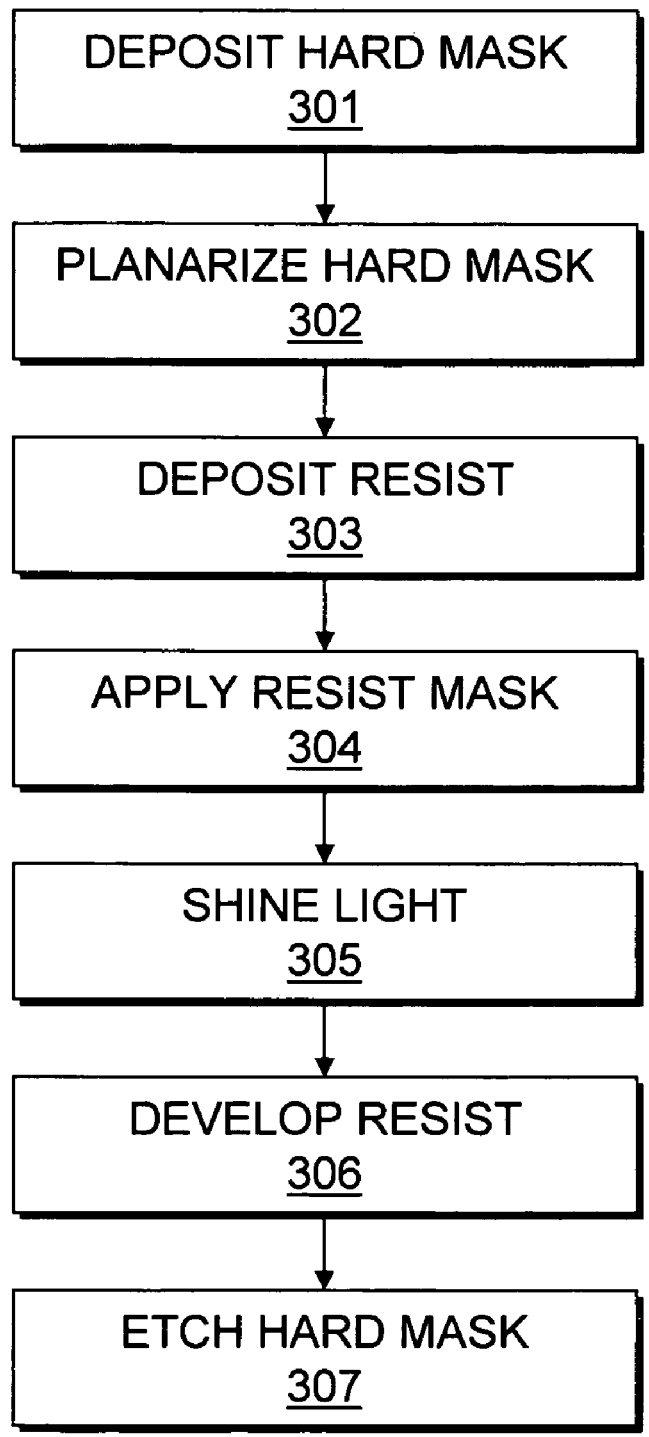
FIG. 3 is a flow chart illustrating a method for forming a hard mask according to an embodiment of the present invention.

FIG. 3 is a flow chart illustrating a method for forming a hard mask according to an embodiment of the present invention. The procedure illustrated in FIG. 3 may be used to implement the procedure at 102 shown in FIG. 1. At 301, a hard mask is deposited. The hard mask may be produced from a variety of different elements. According to an embodiment of the present invention, the hard mask may be produced from plasma enhanced chemical vapor deposition (PECVD) carbon. Alternatively, the hard mask may be produced from SiO$_2$. According to one aspect of this embodiment, the SiO$_2$ may include low temperature plasma oxide and may be produced using low pressure chemical vapor deposition. The hard mask may also be produced from silicon and one or more nitrogen atoms. According to one aspect of this embodiment, the one or more nitrogen atoms include low temperature plasma nitride. The hard mask may also be produced from fluoro silicate glass. According to one aspect of this embodiment, the fluoro silicate glass includes low temperature plasma fluoride tetraethyl orthosilicate (FTEOS). The hard mask may also be produced from coral and black diamond. According to one aspect of this embodiment, the hard mask may also include a SiO$_2$ cap.

At 302, the hard mask layer is planarized. Planarizing the hard mask makes the mask even and level throughout the surface of the polysilicon. According to an embodiment of the present invention, the hard mask may be planarized using a chemical-mechanical and polish procedure or other planarizing technique.

At 303, photoresist is deposited over the hard mask material. The photoresist may include material such as vinyl cinnamate, phenol-formaldehyde (Novolaks), carboxylic acid, t-Boc-sytrene polymer, or other type of material.

At 304, a first region that includes a polysilicon well of the first type is left exposed while a resist mask is applied over a second region that includes a polysilicon well of the second type.

At 305, light is applied. The light applied may be ultra violet light. The light reacts with the exposed first region, while the masked second region is left unchanged.

At 306, the photoresist over the first region is developed (removed). In this embodiment, the photoresist over the exposed first region is washed away through the use of a developer that makes the exposed photoresist regions more soluble (positive tone). Alternatively, it should be appreciated that procedure 304 may be modified when using a developer that leaves irradiated regions of photoresist less soluble may be used (negative tone).

At 307, the hard mask over the first region is etched away.

It should be appreciated that other than using a photoresist mask to pattern the photoresist, a laser photo process may be used. The laser photo process may use a laser beam to write the photoresist pattern and eliminate the use of a photoresist mask.

Referring back to FIG. 1, at 103 lightly doped drain (LDD) implant is applied to the device. The LDD implant may be applied at zero-degrees. The exposed silicon may be doped with a high concentration of impurities, either though diffusion or ion implantation. The doping penetrates exposed areas on the silicon surface creating n-type or p-type regions (source and drain junctions) in a p-type or n-type substrate. After LDD implantation, the photoresist over the second region may be stripped. Alternatively, the photoresist may be removed prior to LDD implantation. According to an embodiment of the present invention, the photoresist over the second region may be stripped through a dry process or using a solvent.

At 104, angled implantation is performed of the first dopant type to form pockets under the gate of the second dopant type. According to an embodiment of the present invention, implantation may be performed at multiple angles to form shallow and deep pockets.

At 105, the hard mask is stripped.

Procedures 102-105 are specific in describing how a first transistor of the first dopant type is created in the first region. It should be appreciated that procedures 102-105 may be modified to create a second transistor of the second dopant type in the second region.

At 106, spacers are formed adjacent to the gate.

At 107, deep source drain (S/D) implant is performed. The deep source drain implants dopes the exposed silicon with a high concentration of impurities, either through diffusion or ion implantation. The doping further penetrates exposed areas on the silicon surface further defining the n-type or p-type regions (source and drain junctions) deeper in the p-type or n-type substrate. According to an embodiment of the present invention, the dose may be 1E14 to 1E15 Ion/cm$^2$.

At 108, rapid thermal annealing and silicide formation is performed. According to an embodiment of the present invention, rapid thermal annealing operates to activate dopants and to make them more conductive.

Figure 4A:
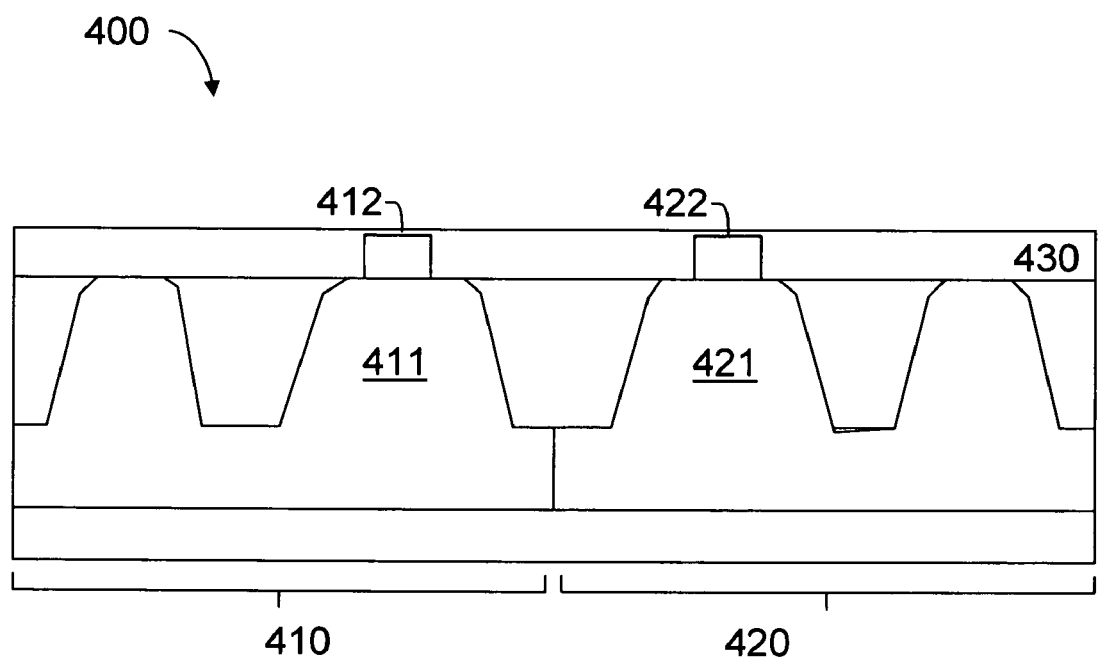
FIGS. 4a-4c illustrate an example of how a hard mask blocking layer is used during angle implantation according to an embodiment of the present invention.
Figure 4B:
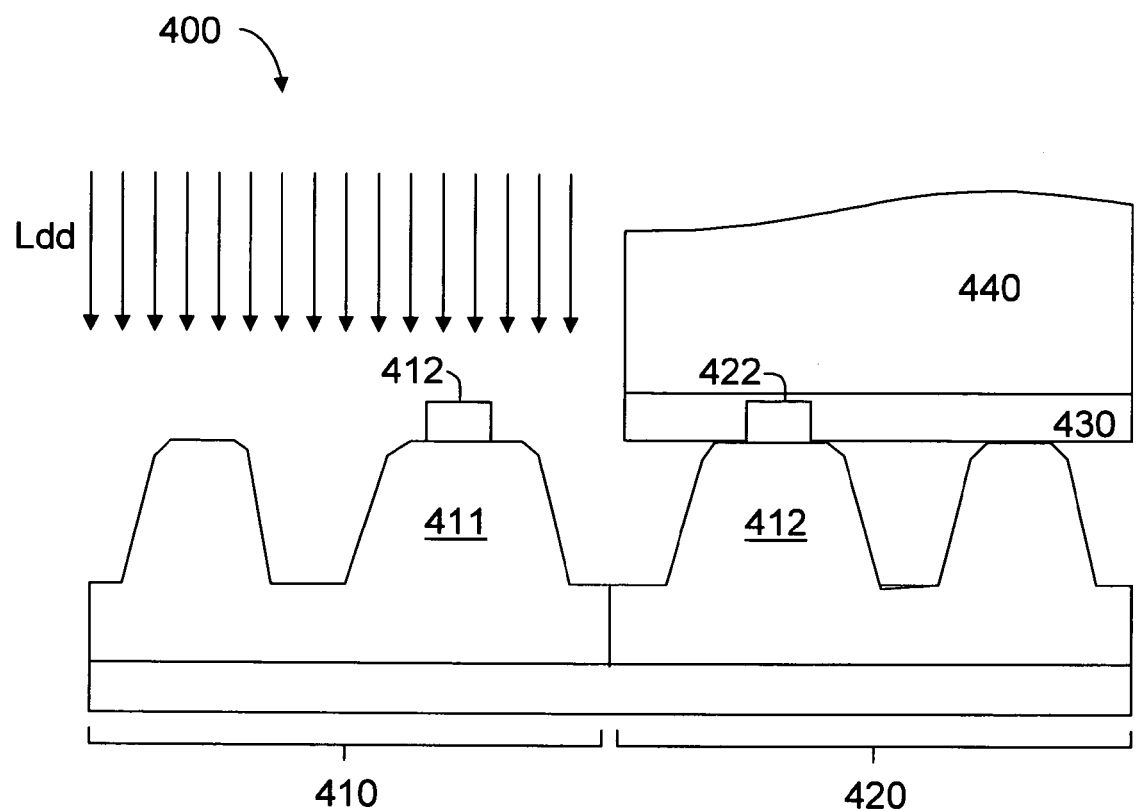
Figure 4C:
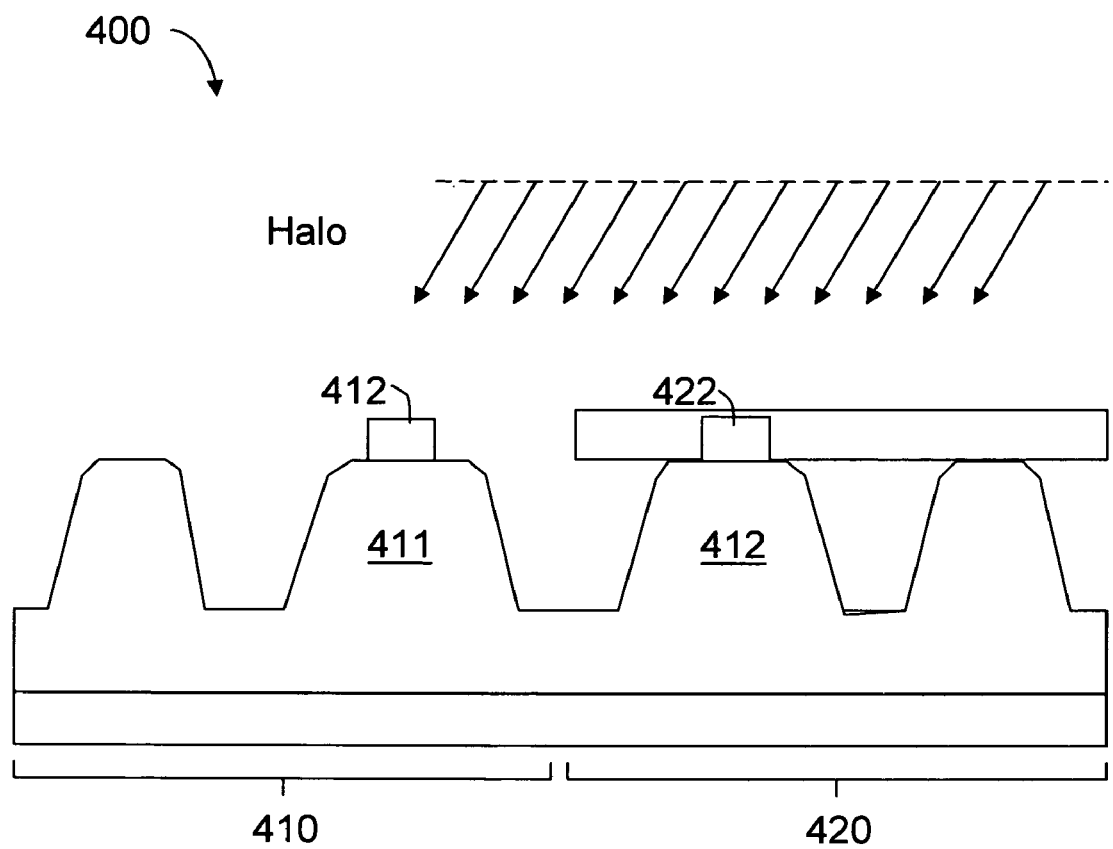

FIGS. 4a-4c illustrate an example of how a hard mask blocking layer is formed and used during angle implantation according to an embodiment of the present invention. FIG. 4a illustrates a section of a wafer 400 having a first region 410 and a second region 420. The first region 410 includes a well 411 that is implanted with a dopant of a first type (either P or N), and a gate 412 that is doped with a dopant of a second type, opposite of the first type. The second region 420 includes a well 421 that is implanted with a dopant of the second type, and a gate 422 that is doped with a dopant of the first type. Hard mask 430 is deposited over the first region 410 and the second region 420. The hard mask 430 may be planarized to produce an even and level surface over first and second regions 410 and 420. FIG. 4a provides an exemplary illustration of the results of procedures 301 and 302 as described with reference to FIG. 3 according to an embodiment of the present invention.

FIG. 4b illustrates the hard mask 430 after it has been patterned. Using an etch procedure, the hard mask over the first region 410 has been removed, exposing the well 411 and the gate 412. The hard mask 430 over the second region 420 remains as well as a layer of photoresist 440 used for preserving the hard mask 430 over the second region 420. The exposed first region 410 may be implanted with zero degree lightly doped drain implant. FIG. 4b provides an exemplary illustration of the results of procedures 303-307 as described with reference to FIG. 3 and 103 as described with reference to FIG. 1 according to an embodiment of the present invention.

FIG. 4c illustrates the hard mask 430 over the second region 420 after the photoresist 440 shown in FIG. 4b has been stripped. Angle (halo) implantation is performed to form pockets. FIG. 4c provides an exemplary illustration of the results of procedure 104 as described with reference to FIG. 1 according to an embodiment of the present invention.

Figure 5A:
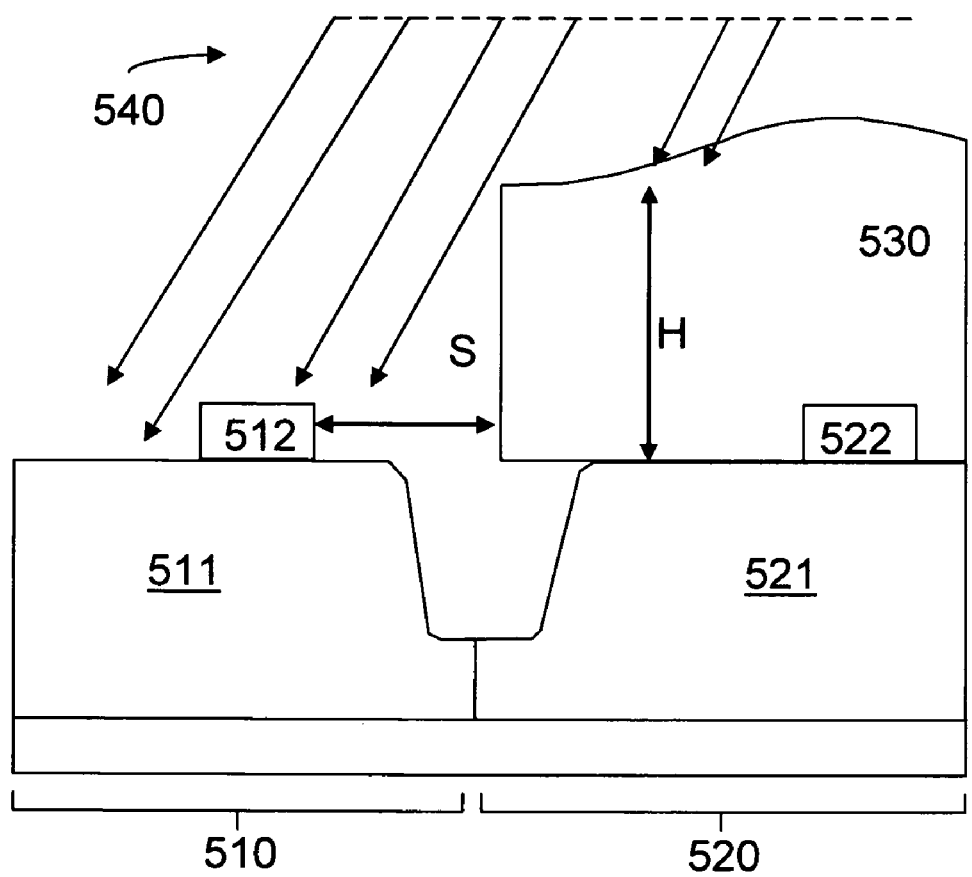
FIGS. 5a-5c illustrate the differences between using a hard mask blocking layer and photoresist according to an alternate embodiment of the present invention.
Figure 5B:
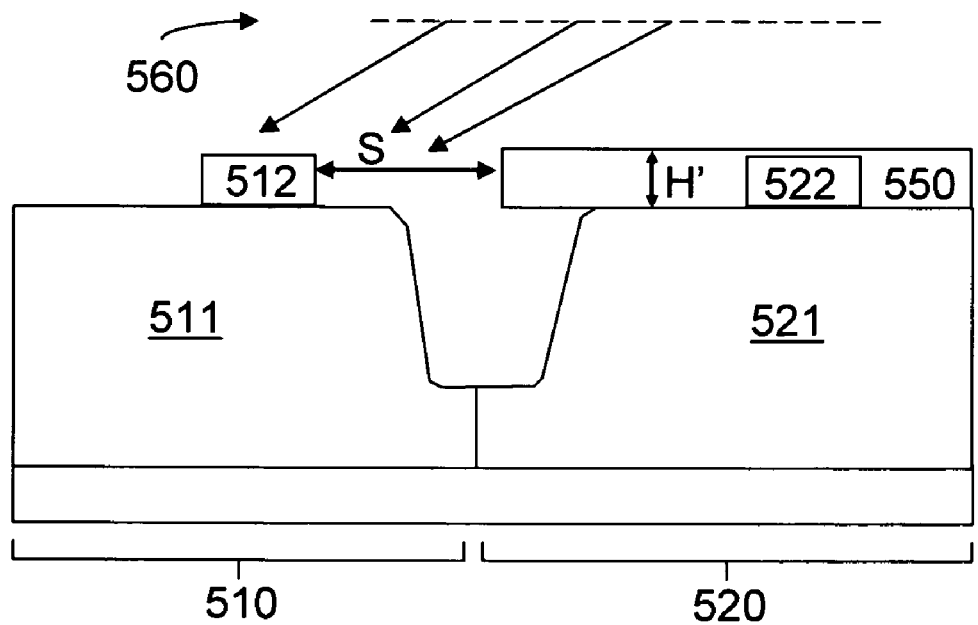
Figure 5C:
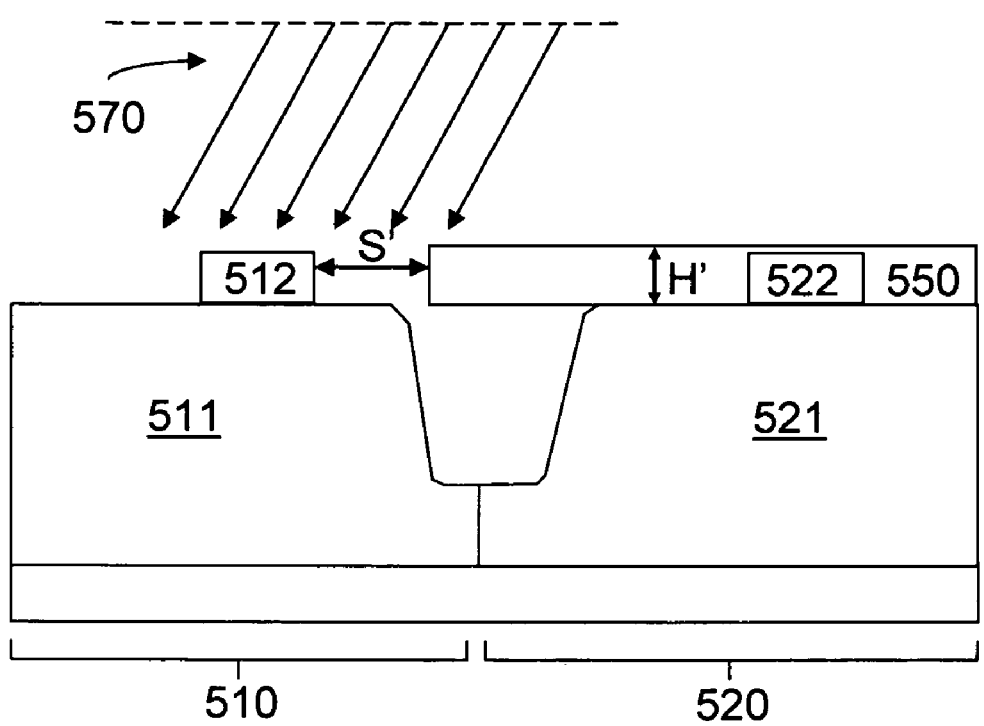

FIGS. 5a-5c illustrate the differences between using a hard mask blocking layer and photoresist according to embodiments of the present invention. FIG. 5a illustrates an example of angle implantation that is performed for pocket implantation of a first region where photoresist is used to cover a second region. As shown, a first region 510 of a section of a wafer 500 includes a well 511 that is implanted with a dopant of a first type (either P or N), and a gate 512 that is doped with a dopant of a second type, opposite of the first type. The second region 520 includes a well 521 that is implanted with a dopant of the second type, and a gate 522 that is doped with a dopant of the first type. Photoresist 530 is deposited over the second region 520 to block the second region 520 while angle implantation of dopants 540 is performed to form pockets under the gate 512 in the first region 510. Due to the properties of photoresist 530, an amount of height, H (blocking layer height), is required to effectively block the dopants 540 from the second region 520. The blocking layer height H and the distance between the gate 512 and photoresist 530, S, impacts the angle of implantation that may be used to generate pockets. The blocking layer height, H, produces a shadowing effect that prevents dopants from reaching areas in the first region 510. The higher the value of H and the smaller the value of S, the greater the impact the shadowing effect will have. The distance S may also be described as the shortest distance of an edge of the photoresist 530 (or hard mask as shown in FIGS. 5b and 5c) to an edge of the gate of the second dopant type.

FIG. 5b illustrates an example of angle implantation that is performed for pocket implantation of a first region where a hard mask is used to cover a second region according to an embodiment of the present invention. As shown, a first region 510 of a section of a wafer 500 includes a well 511 that is implanted with a dopant of a first type, and a gate 512 that is doped with a dopant of a second type, opposite of the first type. The second region 520 includes a well 521 that is implanted with a dopant of the second type, and a gate 522 that is doped with a dopant of the first type. A hard mask 550 is deposited over the second region 520 to block the second region 520 while angle implantation of dopants 560 is performed to form pockets under the gate 512 in the first region 510. Since the density of the hard mask 550 is higher than that of photoresist, the blocking layer height of the hard mask 550 may be reduced to H', where H' is less than H. By reducing the blocking layer height while keeping S constant, the angle of implantation may be increased which allows a larger concentration of dopants 560 to be implanted on the surface of the well 511 and underneath gate 512. This produces the desirable result of having a pocket implant profile where the concentration of dopants near the surface of the polysilicon in the well 511 is close to the highest concentration of dopants in the well. According to an embodiment of the present invention, the concentration of the dopants underneath the gate 512 near the surface of the well is x and the greatest concentration of dopants in the well is between x to less than 2*x. This has been found to improve device short channel effect control.

FIG. 5c illustrates an example of angle implantation that is performed for pocket implantation of a first region where a hard mask is used to cover a second region according to an alternate embodiment of the present invention. As shown, a first region 510 of a section of a wafer 500 includes a well 511 that is implanted with a dopant of a first type, and a gate 512 that is doped with a dopant of a second type, opposite of the first type. The second region 520 includes a well 521 that is implanted with a dopant of the second type, and a gate 522 that is doped with a dopant of the first type. A hard mask 550 is deposited over the second region 520 to block the second region 520 while angle implantation of dopants 570 is performed to form pockets under the gate 512 in the first region 510. In this example, the angle implantation is kept the same as from the example in FIG. 5a. However, with the reduction in the blocking layer height of the hard mask 550 to H', the distance between the hard mask 550 and gate 512 may be reduced to S', where S' is smaller than S. Reduction in the hard mask to gate space allows improvement and further reduction of the die size of submicron devices. According to an embodiment of the present invention, S' is greater than H'

Thus, it should be appreciated that by utilizing a hard mask material instead of photoresist during angle implantation, one may increase the angle of implantation, reduce the distance between a gate and blocking/masking material, and/or a combination of the two. In addition, because hard masks are planarizable, unlike photoresist materials, uniformity can be improved between device to device and variability due to the differences in the blocking layer height may be reduced.

Figure 6A:
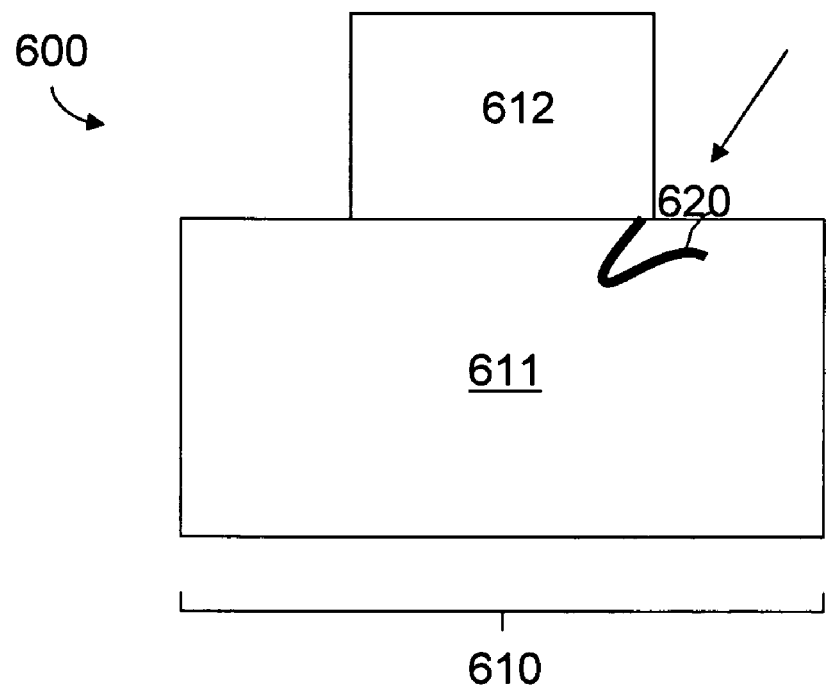
FIGS. 6a-b illustrate exemplary pocket profiles showing the concentration of dopants when a hard mask is used according to an embodiment of the present invention.
Figure 6B:
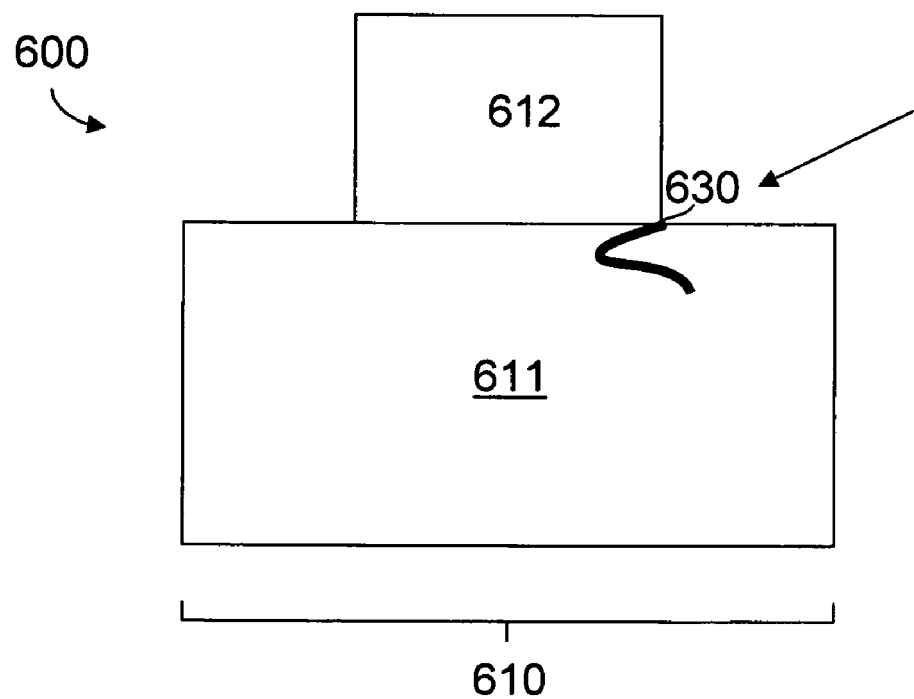

FIGS. 6a-b illustrate exemplary pocket profiles showing the area of concentration of dopants when photoresist and hard masks are used to block angle implantation according to embodiments of the present invention. Both FIGS. 6a-b illustrate a first region 610 of a section of a wafer 600 for implementing a CMOS transistor. The first region 610 includes a well 611 in a polysilicon that is implanted with dopants of a first type (P or N type). The first region 610 includes a gate 612 implanted with dopants of a second type that is the opposite of the first type. The polysilicon includes pockets 613 created during angle implantation. FIG. 6a illustrates a pocket implant profile created when photoresist is used to block a second region during angle implantation. The height of the photoresist places a limitation on the angle of implantation such that implantation directly under the gate 612 in the well 611 is limited. FIG. 6b illustrates a pocket implant profile 620 created when a hard mask is used to block the second region during angle implantation. By using a hard mask with a reduced blocking layer height, angle implantation may be performed using a larger angle. As shown, where the approach in FIG. 6a allows an angle of 45 degrees to be used for angle implantation, the approach in FIG. 6b allows an angle greater than 45 degrees. By increasing the angle for angle implantation, a larger concentration of dopants are implanted directly underneath the gate 612 in the well 611 near and at the surface of the polysilicon. This is desirable because when a smaller concentration of dopants is implanted deeper into the well 611, the transistor becomes less susceptible to short channel effects.

Figure 7A:
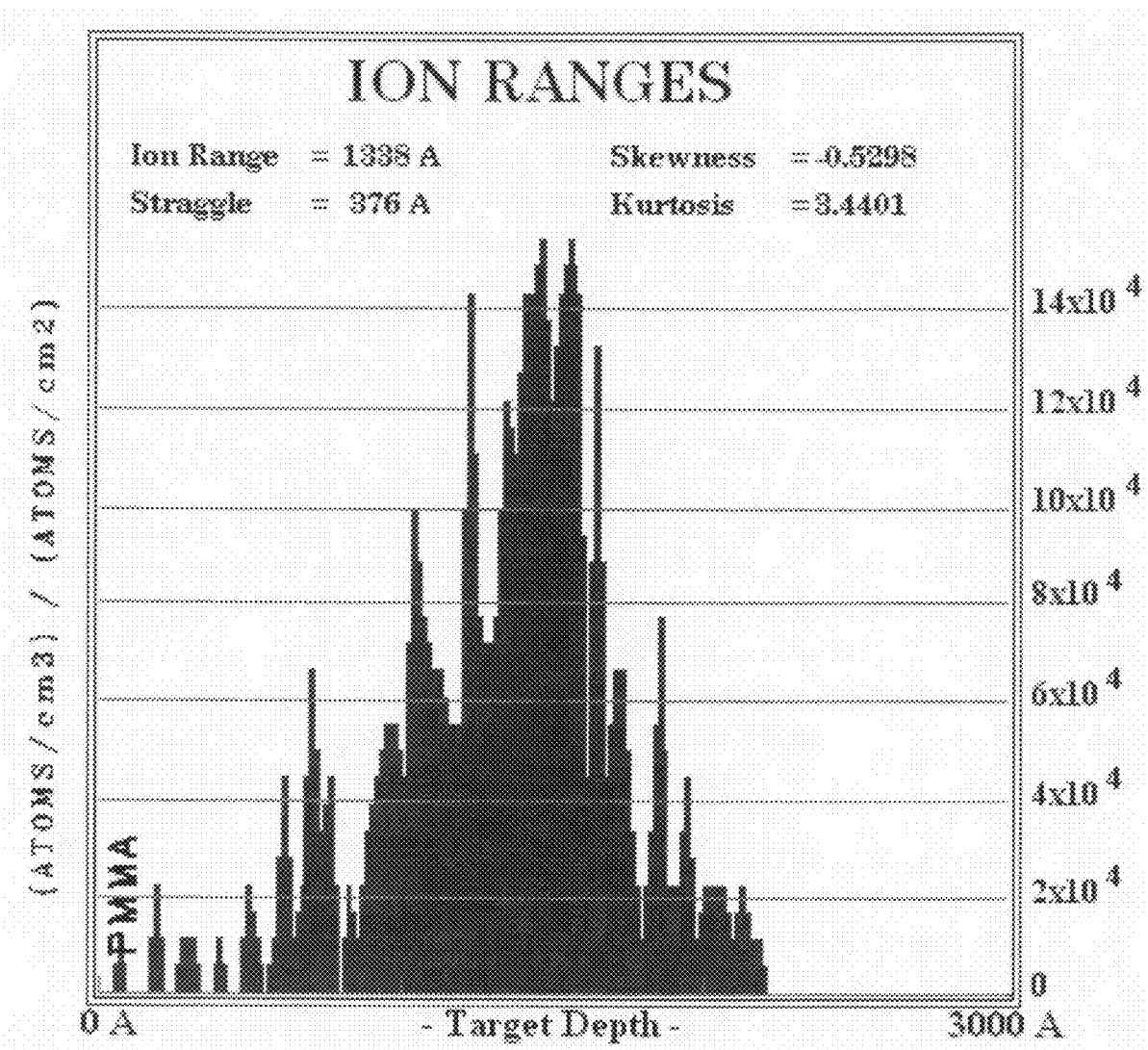
FIGS. 7a-7b illustrate the ion range of photoresist and a hard mask blocking layer according to embodiments of the present invention.
Figure 7B:
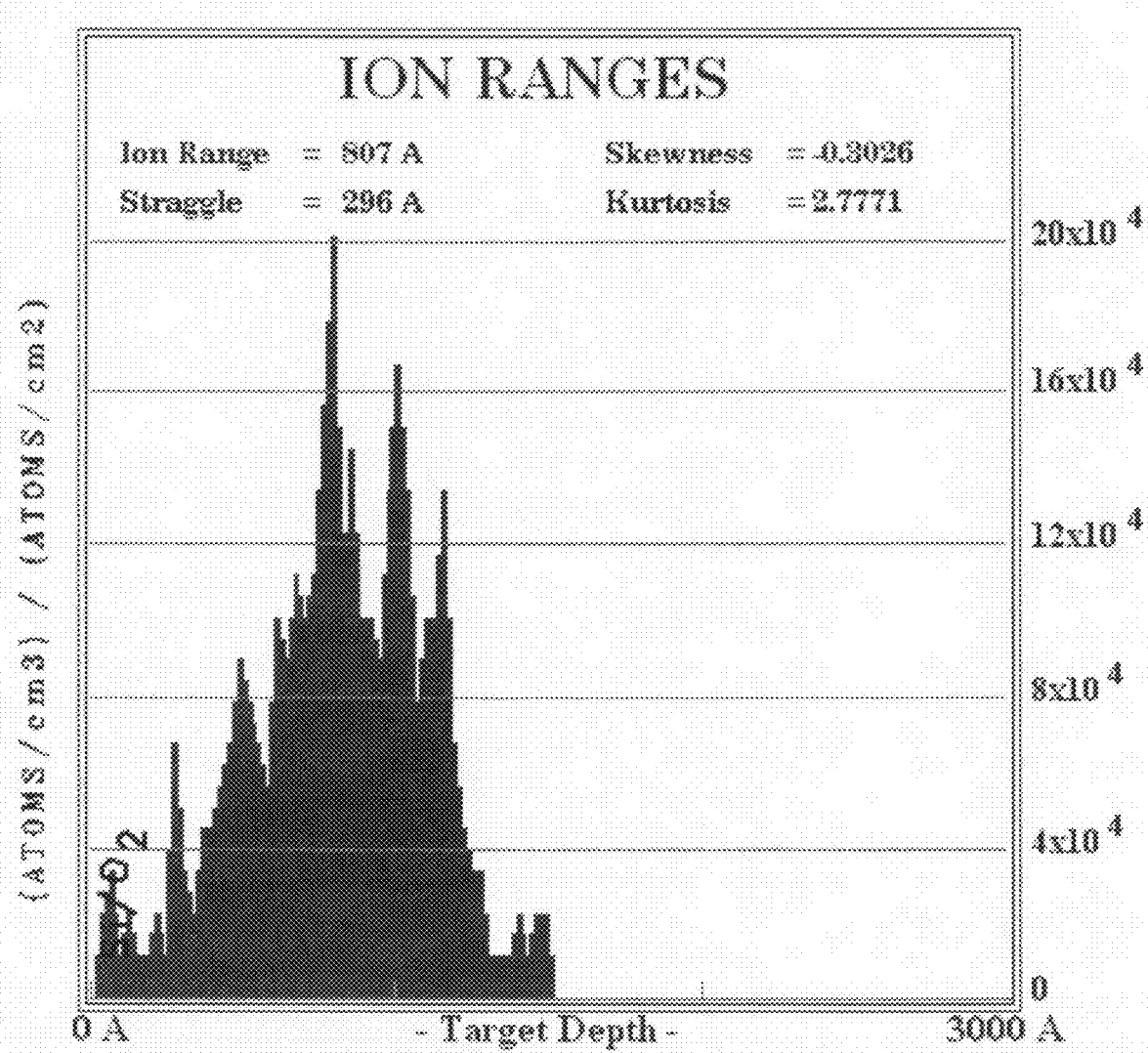

FIGS. 7a-7b illustrate the ion range of for implantation on photoresist and a hard mask blocking layer according to an embodiment of the present invention. FIG. 7a illustrates that for photoresist, a maximum range a species can implant is 2200 A. Thus, a photoresist material needs to be approximately 3000 A in thickness in order to prevent ions from implanting through the material onto polysilicon. FIG. 7b illustrates that for hard mask, a maximum range a species can implant is 1500 A. Thus, a hard mask needs to be approximately 2000 A in order to prevent ions from implanting through onto polysilicon material. Thus, the blocking layer height of photoresist is higher than the blocking layer height of the hard mask.

FIGS. 1, 2, and 3 are flow charts illustrating methods according to embodiments of the present invention. The techniques illustrated in these figures may be performed sequentially, in parallel or in an order other than that which is

What is claimed is:

1. A method for forming a submicron device, comprising:
   depositing a hard mask over a first region that includes a polysilicon well of a first dopant type and a gate of a second dopant type and a second region that includes a polysilicon well of a second dopant type and a gate of a first dopant type;
   performing a chemical-mechanical and polish (CMP) procedure on the hard mask;
   removing the hard mask over the first region; and
   performing angled implantation of the first dopant type after the CMP procedure while the hard mask is over the second region to form pockets under the gate of the second dopant type, wherein the angled implantation originates from a direction of the second region and travels toward a direction of the first region and the pockets formed under the gate of the second dopant type are on a side closest to the second region.

2. The method of claim 1, wherein the hard mask has a density that is higher than photoresist.

3. The method of claim 1, wherein the hard mask is plasma enhanced chemical vapor deposition (PECVD) carbon.

4. The method of claim 1, wherein the hard mask comprises $SiO_2$.

5. The method of claim 4, wherein the $SiO_2$ includes low temperature plasma oxide.

6. The method of claim 4, wherein the $SiO_2$ is produced from low pressure chemical vapor deposition.

7. The method of claim 1, wherein the hard mask comprises silicon and one or more nitrogen atoms.

8. The method of claim 7, wherein the one or more nitrogen atoms includes low temperature plasma nitride.

9. The method of claim 1, wherein the hard mask comprises fluoro silicate glass.

10. The method of claim 9, wherein the fluoro silicate glass includes low temperature plasma fluoride tetraethyl orthosilicate (FTEOS).

11. The method of claim 1, wherein the hard mask comprises coral and black diamond.

12. The method of claim 11, wherein the hard mask includes a $SiO_2$ cap.

13. The method of claim 1, wherein removing the hard mask comprises:
   depositing photoresist material on the first and second regions;
   applying a mask on the first region;
   exposing a masked first region and unmasked second region to light;
   removing the photoresist over the first region; and
   etching away the hard mask over the first region.

14. The method of claim 1, wherein removing the hard mask comprises:
   depositing photoresist material on the first and second regions;
   applying a mask on the first region;
   scanning a laser over the photoresist material over the second region; and
   etching away the hard mask over the first region.

15. The method of claim 1, further comprising removing the hard mask over the second region.

16. The method of claim 1, wherein a concentration of dopants at a location in the pockets bordering a surface of a polysilicon is n and a greatest concentration of dopants in the pockets is less than 2*n.

17. A method for forming a submicron device, comprising:
   depositing a hard mask of height h over a first region that includes a polysilicon well of a first dopant type and a gate of a second dopant type and a second region that includes a polysilicon well of a second dopant type and a gate of a first dopant type;
   removing the hard mask over the first region such that the shortest distance of an edge of the hard mask to an edge of the gate of the second dopant type is s where s is greater than h; and
   performing angled implantation of the first dopant type of greater than 45 degrees from a line perpendicular to a surface of the first region, where the angled implantation originates from a direction of the second region and travels toward a direction of the first region, to form pockets under the gate of the second dopant type on a side closest to the second region while the hard mask is over the second region.

18. The method of claim 17, further comprising performing a chemical-mechanical and polish procedure on the hard mask.

19. The method of claim 17, wherein the hard mask has a density that is higher than photoresist.

20. The method of claim 17, wherein a concentration of dopants at a location in the pockets bordering a surface of a polysilicon is n and a greatest concentration of dopants in the pockets is less than 2*n.

21. The method of claim 17, wherein the hard mask is plasma enhanced chemical vapor deposition (PECVD) carbon.

22. The method of claim 17, wherein the hard mask comprises $SiO_2$.

23. The method of claim 17, wherein removing the hard mask comprises:
   depositing photoresist material on the first and second regions;
   applying a mask on the first region;
   exposing a masked first region and unmasked second region to light;
   removing the photoresist over the first region; and
   etching away the hard mask over the first region.

24. The method of claim 17, wherein removing the hard mask comprises:
   depositing photoresist material on the first and second regions;
   applying a mask on the first region;
   scanning a laser over the photoresist material over the second region; and
   etching away the hard mask over the first region.

25. The method of claim 17, further comprising removing the hard mask over the second region.

26. The method of claim 17, further comprising performing a chemical-mechanical and polish (CMP) procedure on the hard mask prior to performing angled implantation.

27. A method for forming a submicron device, comprising:
depositing a hard mask over a first region that includes a polysilicon well of a first dopant type and a gate of a second dopant type and a second region that includes a polysilicon well of a second dopant type and a gate of a first dopant type;
removing the hard mask over the first region; and
performing angled implantation of the first dopant type to form pockets under the gate of the second dopant type, wherein a concentration of dopants at a location in the pockets bordering a surface of a polysilicon is n and a greatest concentration of dopants in the pockets is less than 2*n.

28. The method of claim 27, further comprising performing a chemical-mechanical and polish procedure on the hard mask prior to performing angled implantation.

29. The method of claim 27, wherein the angled implantation originates from a direction of the second region and travels toward a direction of the first region and the pockets formed under the gate of the second dopant type are on a side closest to the second region while the hard mask is over the second region.

* * * * *